United States Patent

Nakayama et al.

[11] Patent Number: 5,851,589
[45] Date of Patent: *Dec. 22, 1998

[54] METHOD FOR THERMAL CHEMICAL VAPOR DEPOSITION

[75] Inventors: Izumi Nakayama, Hiratsuka; Akitoshi Suzuki, Chigasaki; Yoshiro Kusumoto, Chigasaki; Kazuo Takakuwa, Chigasaki; Tetsuya Ikuta, Chigasaki, all of Japan

[73] Assignee: Nihon Shinku Gijutsu Kabushiki Kaisha, Chigasaki, Japan

[*] Notice: The term of this patent shall not extend beyond the expiration date of Pat. No. 4,924,807.

[21] Appl. No.: 311,438

[22] Filed: Sep. 26, 1994

Related U.S. Application Data

[63] Continuation of Ser. No. 200,363, Feb. 23, 1994, abandoned, which is a continuation of Ser. No. 513,028, Apr. 25, 1990, abandoned, which is a continuation of Ser. No. 65,909, Jun. 24, 1987, abandoned.

[30] Foreign Application Priority Data

Jun. 28, 1986 [JP] Japan ................................. 61-152123
Aug. 22, 1986 [JP] Japan ................................. 61-197737

[51] Int. Cl.⁶ ........................................................ C23C 16/00
[52] U.S. Cl. .................. 427/248.1; 427/255; 427/255.1; 427/255.2; 427/250; 427/314
[58] Field of Search ........................... 427/248.1, 255.1, 427/255.2, 255.3, 250, 255, 314; 118/715, 720

[56] References Cited

U.S. PATENT DOCUMENTS

| | | |
|---|---|---|
| 3,516,811 | 6/1970 | Gatchet et al. .................... 427/255 |
| 3,805,736 | 4/1974 | Foehring et al. .................... 118/715 |
| 4,468,283 | 8/1984 | Ahmed .................... 427/255.1 |
| 4,508,054 | 4/1985 | Baumberger et al. .................... 427/255.2 |
| 4,569,855 | 2/1986 | Matsuda et al. .................... 427/583 |
| 4,588,610 | 5/1986 | Yamazaki .................... 427/583 |
| 4,595,601 | 6/1986 | Horioka et al. .................... 427/583 |
| 4,800,105 | 1/1989 | Nakayama et al. .................... 427/253 |
| 4,849,260 | 7/1989 | Kusumoto et al. .................... 427/250 |
| 4,924,807 | 5/1990 | Nakayama et al. .................... 118/725 |
| 4,994,301 | 2/1991 | Kusumoto et al. .................... 427/56.1 |

FOREIGN PATENT DOCUMENTS

| | | |
|---|---|---|
| 59-140368 | 8/1984 | Japan .................... 427/53.1 |
| 60-130126 | 7/1985 | Japan . |
| 60-166030 | 8/1985 | Japan . |
| 60-245217 | 12/1985 | Japan . |
| 60-80271 | 4/1987 | Japan .................... 118/725 |

OTHER PUBLICATIONS

Bunshah et al., *Deposition Technologies for Films and Coatings* Noyes Publications 1982 pp. 6, 15–16.

Zorpette, "True Blue, on the verge of realizing the quest for a blue laser", Scientific American, Sep. 1997, p. 36.

*Primary Examiner*—Roy V. King
*Attorney, Agent, or Firm*—Larson & Taylor

[57] ABSTRACT

A method and an apparatus for a CVD comprising feeding a first gas flow, including a reactive gas, in a laminar flowing state and in a sheet state parallel to the surface of a substrate and feeding a second gas flow, including a non-reactive gas, in a direction perpendicular to that of said first gas flow, externally controlling the flow rates of the first and second gases so as to retain the laminar flowing state of said first gas flow and concentrate said first gas flow in the vicinity of said substrate and externally controlling the flow rate of said second gas flow to provide control and uniformity in the thickness of the layer to be formed.

4 Claims, 7 Drawing Sheets

PRIOR ART

PRIOR ART

METHOD FOR THERMAL CHEMICAL VAPOR DEPOSITION

This application is a continuation of application Ser. No. 08/200,363 filed Feb. 23, 1994, now abandoned which is a continuation of U.S. Ser. No. 07/513,028, filed Apr. 25, 1990, now abandoned, which is a continuation of U.S. Ser. No. 07/065,909, filed Jun. 24, 1987, now abandoned.

FIELD OF THE INVENTION

This invention relates to methods of and apparatus for a chemical vapor deposition (CVD).

BACKGROUND OF THE INVENTION

A chemical vapor deposition has the potential to provide improved microfabrication techniques for high density VLSI circuits. In a conventional CVD apparatus used for such microfabrication techniques, a reaction gas or a reaction gas diluted with a carrier gas is fed in a single direction through a single pipe, a pipe or plate having a number of openings into a vacuum chamber or a reaction chamber. Two internal parameters such as pressure and reaction gas flow rate are merely employed as flow control parameters, and it is impossible to externally control so as to suppress the production of a turbulent flow or to suppress natural convection. Thus, the conventional methods have problems that films cannot be formed with excellent reproducibility, controllability and uniformity in wide pressure and flow rate ranges. Since the conventional methods diffuse reaction components in all area in the chamber, it is unavoidable to adhere the reaction components to the chamber walls or an inspection window. Thus, these methods have problems that dusts are produced, and impurities are mixed in thin films.

Further, the above-described conventional methods have the following drawbacks.

With the conventional CVD system, for example, when a $SiO_2$ layer is formed as a thin insulating layer on a Si substrate, and a thin metal layer (made, for example, of tungsten) is formed at the portion of the substrate where the $SiO_2$ layer is not formed, i.e. in a contact hole, an encroachment phenomenon in which a metal element may be invaded into a gas between the substrate and the thin insulating layer to be grown is unavoidable in the step of growing a thin film while feeding $WF_6$ gas forming the thin metal layer and a reducing gas $H_2$. In the extreme case, cavities may be produced in the substrate.

In the above-mentioned conventional system, the turbulent flow or the natural convection occurs near the substrate. This is considered that the turbulent flow or the natural convection accelerates the growth of the above-described encroachment or the voids. However, the conventional system has only two internal parameters such as the pressure and the reaction gas flow rate as control parameters, and it is impossible to externally control these parameters to suppress the production of the turbulent flow or to suppress the natural convection. Therefore, the conventional system has problems that the metal film cannot be formed with excellent reproducibility, controllability and uniformity in wide pressure and flow rate ranges by suppressing the growth of the encroachment and the voids.

It is, therefore, an object of this invention to provide a method of a chemical vapor deposition which eliminates the drawbacks of the above-mentioned conventional methods, can externally control the stability of reaction gas flow, and concentrates reaction components only in the vicinity of a substrate, thereby growing a thin film of high quality on the substrate with excellent reproducibility, uniformity and controllability.

Another object of the invention is to provide an apparatus for a chemical vapor deposition in which the stability of reaction gas flow can be externally controlled, and reaction components can be concentrated only in the vicinity of a substrate, thereby growing a thin film of high quality on the substrate by providing excellent reproducibility, uniformity and controllability.

A further object of the invention is to provide an apparatus for a chemical vapor deposition in which the growth of the above-mentioned encroachment and the voids can be effectively suppressed by parameters such as growing temperature, reaction gas concentration independent from the internal parameters.

SUMMARY OF THE INVENTION

According to one aspect of this invention, there is provided a gas flowing method of a chemical vapor deposition comprising feeding a first gas in a sheet state substantially parallel to a surface of a substrate positioned in a sealed chamber, and feeding a second gas oppositely to the surface of said substrate, thereby retaining a laminar flowing condition of the first gas in the vicinity of the surface of said substrate.

The first gas which is to be fed in parallel to the surface of said substrate may consist of a gas containing a reactive gas or mainly reactive gas.

The second gas which is to be fed oppositely to the surface of said substrate may consist of a gas containing an inert gas or mainly inert gas.

According to a second aspect of this invention, there is provided a chemical vapor deposition apparatus comprising a sealed chamber; a substrate disposed in the sealed chamber; a substrate holder for supporting the substrate and having heating means; first feeding means for feeding a first gas in a sheet state substantially parallel to the surface of the substrate; and second feeding means for feeding a second gas oppositely to the surface of the substrate, thereby retaining a laminar flowing condition of the first gas flow by the second gas flow in the vicinity of the substrate while heating the substrate on the substrate holder by the heating means.

The first gas flow can be retained in a laminar flowing state with good controllability in all areas near the substrate. In other words, the second gas flow dynamically suppresses the blowup of the first gas flow near the substrate and prevents the turbulent flow or diffusion of the first gas components.

The uniformity in thickness of the layer to be formed on the substrate can be controlled by controlling the flow rate of the second gas flow.

The flows of the gases become laminar to suppress the growth of the encroachment and the voids, thereby achieving the formation of the film with good controllability and reproducibility.

Since the first gas components can be suppressed only near the substrate, contamination of the walls and the inspection window of the sealed or vacuum chamber can be prevented.

The film of high quality can be formed on the substrate.

The above and other objects, features, and advantages of the present invention will become apparent upon consideration of the flowing detailed description of specific embodiments thereof, especially when taken in conjunction with the accompanying drawings.

DETAILED DESCRIPTION OF THE INVENTION

Figure 1:
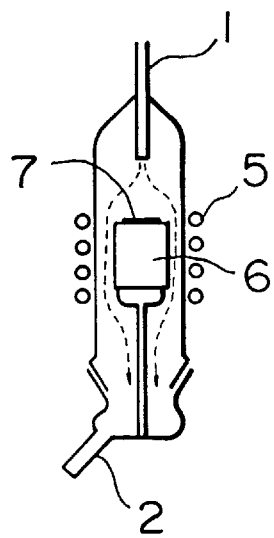
FIGS. 1, 2, 3, 4, 5, 6 and to 7 are respectively schematic views showing gas flowing methods in conventional CVD apparatus.

Reference is now made to FIGS. 1 to 7 of the drawings which schematically shows various conventional CVD apparatuses.

In FIGS. 1 to 7, reference numeral 1 denotes a reaction gas feeding pipe, 2 an outlet, 3 a pipe having a plurality of openings for feeding a reaction gas, 4 a planar member having a plurality of opening for a reaction gas, 5 a heater, 6 indicates a wafer supporting member or tray, and numeral 7 depicts a wafer (substrate).

Figure 2:
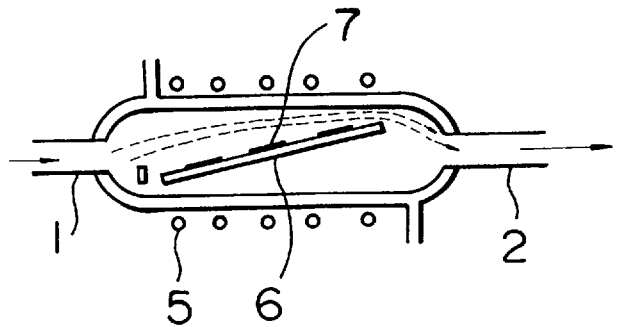
Figure 3:
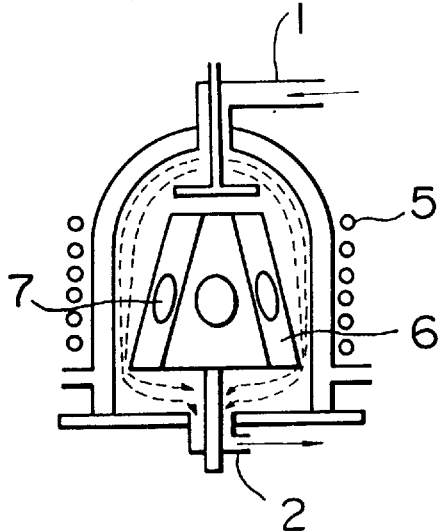
Figure 4:
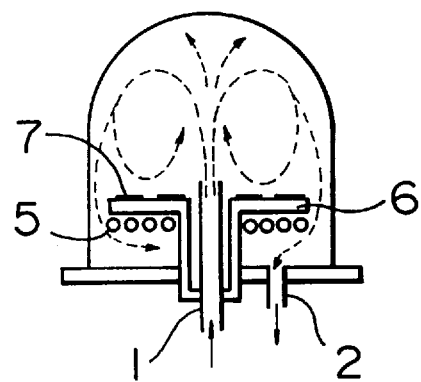
Figure 5:
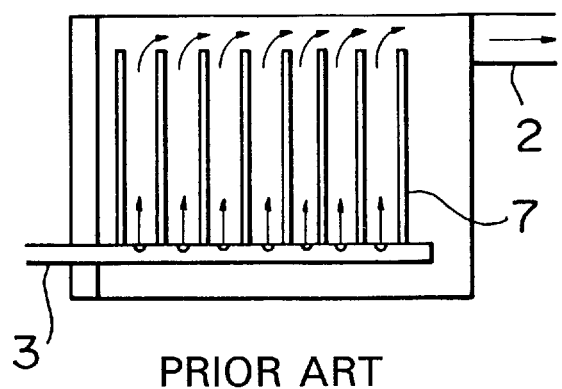
Figure 6:
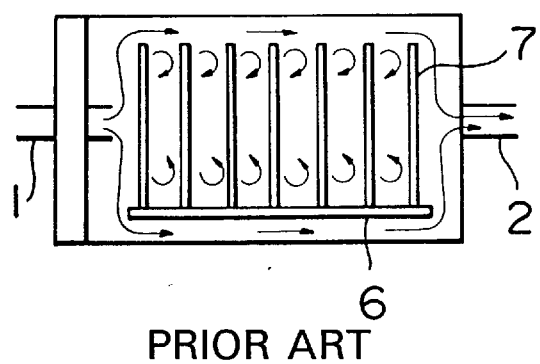
Figure 7:
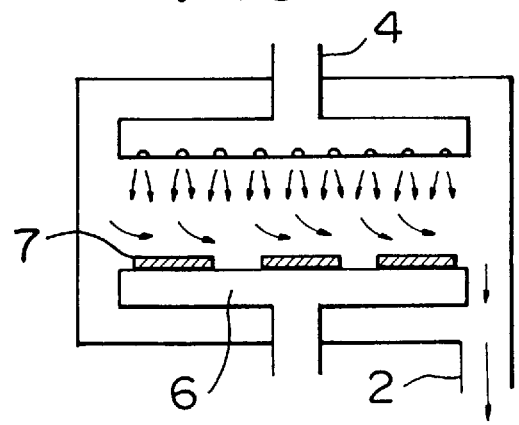

In FIG. 1, the reaction gas is blown vertically from above the substrate 7 to be heated through a single pipe 1. In FIG. 2, the reaction gas is fed through the single pipe 1, and an inclined supporting tray 6 is used to compensate a low accumulating velocity at an outlet side. In FIG. 3 substantially the same gas flowing type as that shown in FIG. 2 is employed in the reduced pressure (less than 10 Torr) state of the degree that the influence of buoyancy can be ignored. In FIG. 4, the substrate 7 is not directly exposed with the reaction gas, but a recirculating flow of the gas due to heat convection is utilized. In FIG. 5, a vertical diffusion furnace type is employed in which the reaction gas is blown to gaps among substrates 7. In FIG. 6, this is the most general diffusion furnace type in which, similar to that in FIG. 4, the surfaces of substrates are not directly contacted with the reaction gas flow. In FIG. 7, this is frequently used in a method of plasma CVD in which the reaction gas is blown through the openings of the planar member 4 to the substrates 7.

Figure 23:
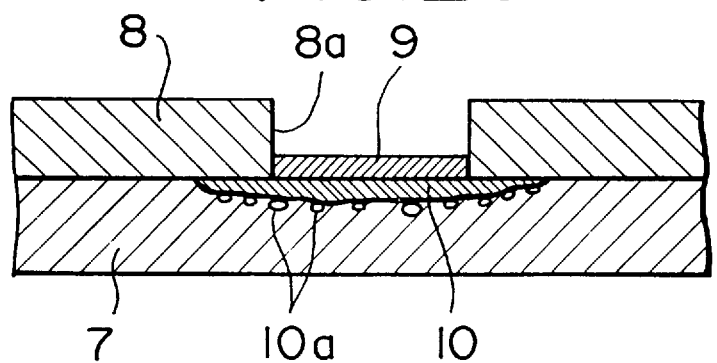
FIG. 23 is a sectional view of a substrate showing an example that a thin film is formed according to a conventional method.

An example in which a thin film is formed on a substrate by any one of the conventional CVD systems is illustrated in FIG. 23.

In FIG. 23, reference numeral 7 designates an Si substrate, an $SiO_2$ film 8 is formed as a thin insulating film on the substrate 7, and a thin metal film 9 (made, for example, of W) is formed at a portion where the film 8 is not formed, i.e., in a contact hole 8a. However, an encroachment phenomenon in which a metal element is invaded to a gap between the substrate 7 and the thin insulating film 8 to be grown is unavoidable in the step of growing a thin film while feeding $WF_6$ gas containing the metal element, W for forming the thin metal film 9 and reducing gas $H_2$. In FIG. 23, reference numeral 10 designates a metal element invading portion (encroachment). In the extreme case, voids 10a are produced in the Si substrate 7.

Embodiments of a CVD apparatus according to this invention will now be described with reference to FIGS. 8 to 22.

FIGS. 8 to 17 show a first embodiment. A reaction gas injecting nozzle 11 is mounted through one side wall of a vacuum chamber 12 in a hermetically sealing manner, and the inner end portion 11a of the nozzle 11 is reduced in thickness to provide a slit-like opening. Reaction gas fed through a supply pipe 13 is injected from the slit-like opening into the inner space 14 of the vacuum chamber 12. An outlet 15 is formed at one end of the bottom wall of the vacuum chamber 12.

Figure 8:
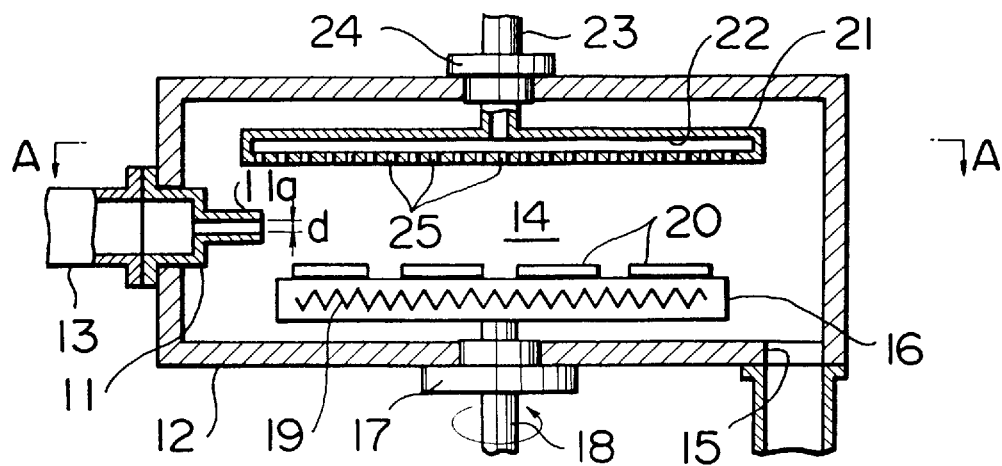
FIG. 8 is a sectional view of a first embodiment of a CVD apparatus according to this invention.
Figure 9:
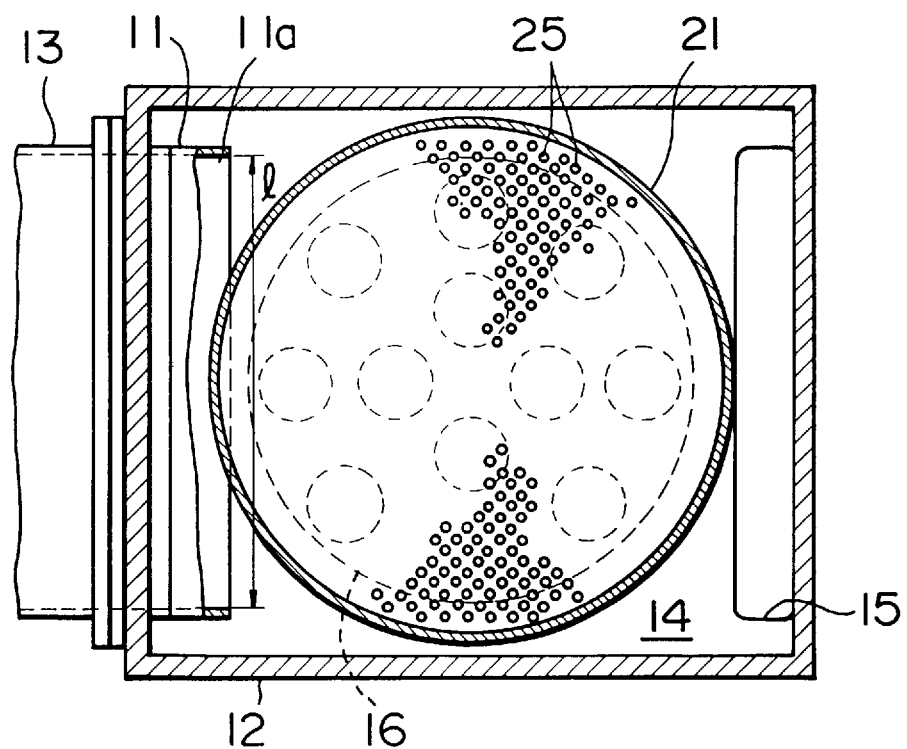
FIG. 9 is a sectional view taken along the line A—A in FIG. 8.

A circular disk-shaped substrate supporting tray 16 is disposed below the end portion 11a of the nozzle 11 in the vacuum chamber 12, hermetically sealed by a sealing member 17, and integrated with a rotating shaft 18 projected externally of the vacuum chamber 12 to be rotated at a predetermined speed in a direction as designated by an arrow in FIG. 8. The substrate supporting tray 16 contains a heater 19 to heat substrates 20 placed on the tray 16.

An inert gas injecting plate 21 is disposed oppositely to and above the substrate supporting tray 16 in the vacuum chamber 12, and has a hollow portion 22, to which inert gas is fed from a pipe 23 mounted through the upper wall of the vacuum chamber 12 and sealed by a sealing member 24. A number of small pores 25 are formed in the bottom wall of the inert gas injecting plate 21, thereby injecting the inert gas therefrom downward.

The end portion 11a of the nozzle 11 (in the injecting direction of the reaction gas) extends substantially parallel to the upper surface of the substrate supporting tray 16 on which the substrates 20 are placed, and the slit-like opening also extends in parallel with the upper surface of the tray 16. The arrangement may be so designed that the width "d" of the slit-like opening of the end portion 11a of the nozzle 11 is sufficiently smaller than the length "l" of the slit-like opening of the end portion 11a of the nozzle 11 and the reaction gas is injected from the slit-like opening at a flowing velocity that Reynolds number is 10 or larger. Further, the distance from the upper surface of the substrate supporting tray 16 to the level of the end portion 11a of the nozzle 11 is approx. 40% of the distance from the upper surface of the tray 16 to the inert gas injecting plate 21.

The operation of the embodiment constructed as described above will now be described with reference to FIGS. 10, 11 and 12.

The reaction gas "R" is injected from the end portion 11a of the nozzle 11 in a two-dimensional jet state into the space 14 (see FIG. 8) in the vacuum chamber 12. The space 14 is previously evacuated in vacuum state. On the other hand, the inert gas "Q" is injected downward from the inert gas injecting plate 21. The injecting flow rates of the reaction gas R and the inert gas Q can be externally controlled, and the latter is set, for example, at the flow rate to three times as large as the former. The substrate supporting tray 16 is rotated at a predetermined speed, and is heated by the heater 19.

Figure 10:
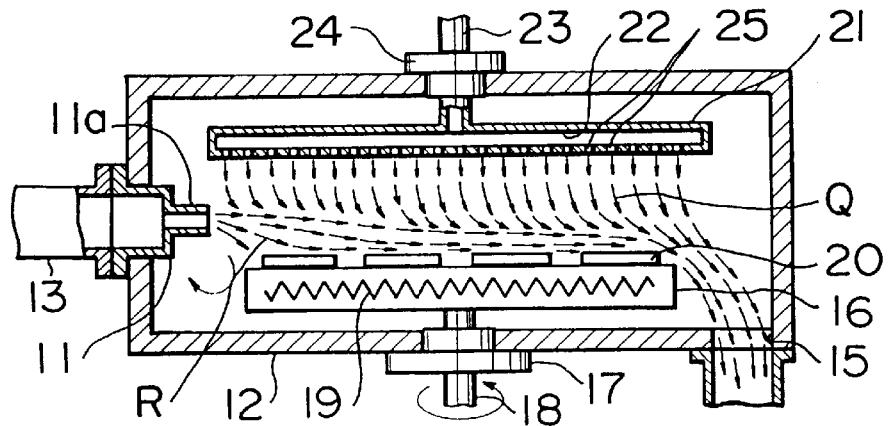
FIGS. 10, 11 and 12 are sectional views similar to that of FIG. 1 to explain the operation of the embodiment, respectively.

As shown in FIG. 10, the flow of the reaction gas R is limited to the vicinity of the substrates 20, and is retained in a laminar flowing state. This is considered that the flow of the inert gas Q forces the flow of the reaction gas R down. Such a stabilizing action is confirmed by a numerical simulation by a computer and visualization technique using a titanium tetrachloride. When the flow is observed in the entirety, as shown in FIG. 12, the flow of the reaction gas R (hatched) becomes a localized laminar flow so that the flow of the inert gas Q determines the range of the flow. In other words, the shape, the size or the range of the hatched portion can be controlled by controlling the flow rate of the inert gas Q.

Figure 11:
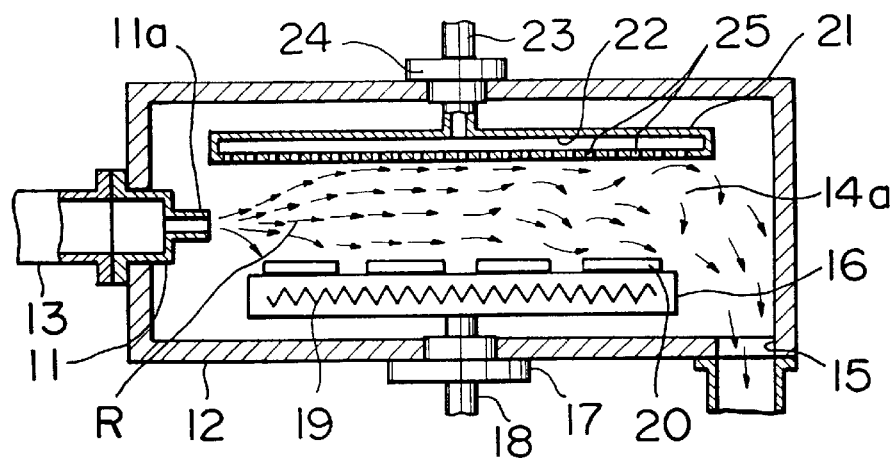

FIG. 11 shows the case that the flow of the inert gas Q is no: presented from above. In this case, the flow of the reaction gas R is diffused as shown so as to become a turbulent flow in the range 14a of the space 14. The walls of the chamber 12 and the inspection window (not shown) are contaminated by such a flow as in the conventional type.

Figure 12:
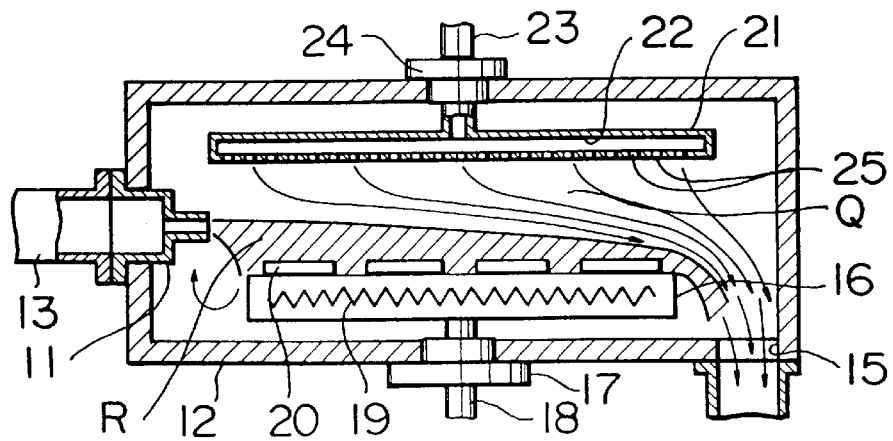

However, according to the embodiment described above, since the flow of the reaction gas R is stabilized as shown in FIG. 10 or 12, the reaction components are limited only to the vicinity of the substrates 20 to prevent the walls of the chamber 12 and the inspection window from contaminating. Therefore, the quality of the film formed on each substrate 20 is improved, and the dust particles can be reduced.

Since the flow of the reaction gas R is in a laminar flow, excellent controllability and reproducibility are provided, the thickness distribution of the film formed on each substrate 20 can be controlled by controlling the flow rate of the inert gas Q.

Figure 13:
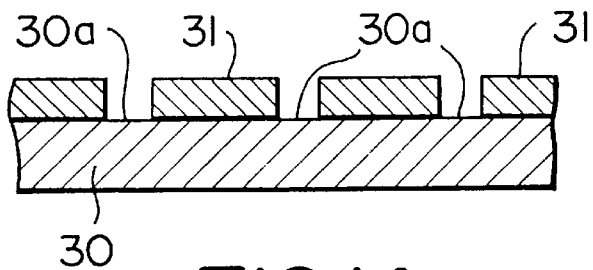
FIGS. 13 to 17 are sectional views showing concrete examples of the substrate applied to the embodiment, respectively.

The case that this embodiment is concretely applied to a substrate will be described. FIG. 13 shows a first concrete example. In this example, a thin metal film of W is formed on a portion 30a of an Si substrate 30 having a thin insulating $SiO_2$ film 31 formed on a part of the surface thereof in such a manner that the thin insulating film 31 is not formed on the portion 30a by feeding a reducing gas $H_2$ and a gas containing a metal element $WF_6$ in a sheet-like state into the pressure reduced chamber 12 while heating the substrate 30 by rotating the substrate holder 16.

A chemical reaction as represented by the following formula (1) is considered to occur as exhibited initially in the portion 30a of the surface of the substrate 30 on which the thin insulating film 31 is not formed in the same manner as the conventional CVD method.

$$WF_6 + 3/2 Si \rightarrow 3/2 SiF_4 + W \qquad (1)$$

Figure 14:
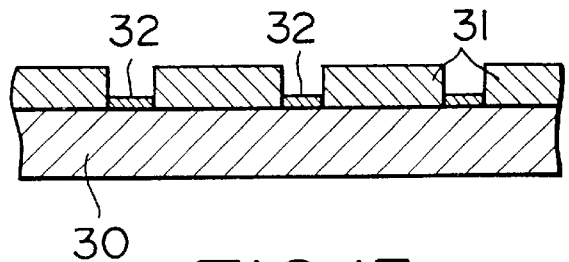

A thin metal film of W, that is a first thin metal film 32 is formed as shown in FIG. 14. However, it is known that the chemical reaction as represented by the above formula (1) is automatically stopped when the thin metal film 32 of W is formed on the portion 30a of the surface of the substrate 18 on which the thin insulating film 31 is not formed and the first thin metal film 32 of W has a thickness of 1000 angstroms or less.

Then, it is also considered that chemical reactions as represented by the following formulas (2) and (3) on the surface of the first thin metal film 32 of W, $$3H_2 \rightarrow 6H \qquad (2)$$

$$WF_6 + 6H \rightarrow 6HF + W \qquad (3)$$

Figure 15:
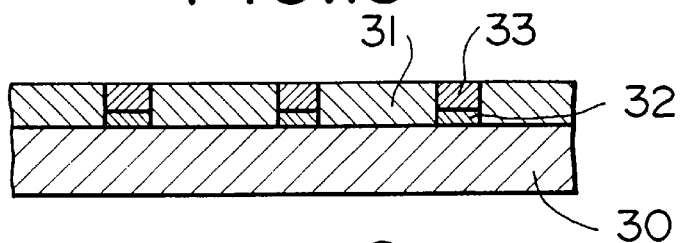

W is grown as time goes, and a thin metal film of W, a second thin metal film 33 is formed on the surface of the first thin metal film 32 of W as shown in FIG. 15.

Comparison experiments of the examples of the case that the reactive gas flow R is controlled by the inert gas flow Q and the case that the reactive gas flows R is not controlled by the inert gas flow Q under the same conditions of the growing temperature, the total pressure and the partial reaction gas pressures have been conducted. First, the first tungsten (W) film was accumulated approx. several hundreds angstroms on the portions (Si is exposed) of two Si wafers on which insulating $SiO_2$ films are formed, disposed in the vacuum chamber, i.e., the contact hole portion under the conditions that tungsten hexafluoride ($WF_6$) was used as reaction gas and argon Ar was used as inert gas at 400° C. of growing temperature under approx. 0.7 Torr of total pressure, one of two wafers was removed from the vacuum chamber, and the state of producing encroachment was observed in section by a scanning electron microscope. Then, a second W film was further grown on the portion in which the $SiO_2$ was not formed on the surface of the remaining one Si wafer in the vacuum chamber, i.e., the first W film grown on the Si surface of the substrate under the same conditions as those described above with tungsten hexafluoride ($WF_6$) and hydrogen $H_2$ as reaction gases and Ar as an inert gas respectively. In addition, how the encroachment produced after the first W film was formed might be extended after the second W film was formed was observed in section by a scanning electron microscope. As a result, it was confirmed by the observation in section by the scanning electron microscope that the extension of the encroachment occurring range in the case that the inert gas flow Q was used when the second W film was formed was extremely reduced as compared with the case that the inert gas flow Q was not used. It was also confirmed that the encroachment suppressing effect by the laminar flowing action of the reaction gas operates as independent parameters from the growing temperature and the pressure with the similar film forming experiments under various conditions of wide range.

Unclear points still exist for the operations which affect the influence of the flowing state of the reaction gas to the encroachment phenomenon, but it is possible to establish the following working assumption. Remarkable encroachment is based upon a phenomenon that a silicon reducing reaction originally should be automatically stopped by coating the silicon surface with the thin metal film, i.e., a phenomenon that the reaction represented by the following formula continues even after the thin metal film was formed.

$$WF_6 + 3/2 Si \rightarrow W + 3/2 SiF_4 \uparrow$$

At this time, it is considered that the reaction gas is supplied through a gap between the side wall of the thin metal film and the side wall of the insulating film, and ultrafine gaps in the thin metal film crystal grain boundary. In order that the silicon reduction continuously advances in the boundary between the thin metal film and the silicon, reactive products ($SiF_4$ in the above reaction formula) must be effectively exhausted to the space. If a turbulent flow exists in the vicinity of the surface of the substrate, the reactive product may be rapidly diffused and exhausted through the gaps by pumping action based on a turbulent flowing diffusion. However, when the surface is covered entirely with the laminar flow, the exhaust of the reactive product must be by a molecule diffusion, which is so delayed that it can be ignored for the turbulent flow diffusion if the gaps are sufficiently narrow. It will be understood the fact that the control of the gas flow near the surface of the substrate largely contributes to the encroachment phenomenon by the above-mentioned assumption.

Figure 16:
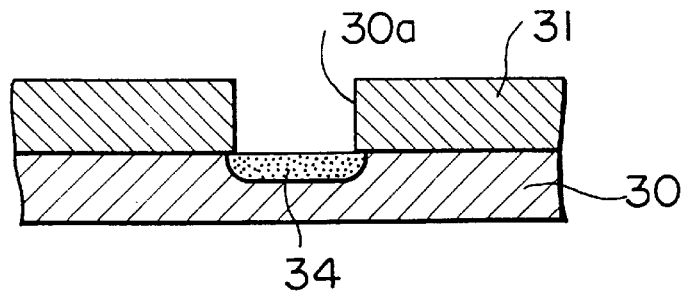
Figure 17:
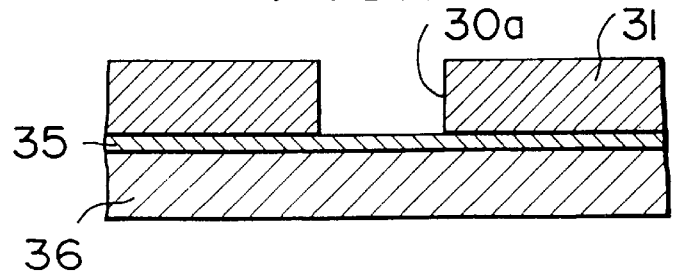

In the first example described above, $H_2$ has been used as the reducing gas and $WF_6$ has been used as the gas containing a metal element. However, this invention is not limited to the particular example. Any of reducing gases and gases containing metal element may be employed. For example, the gas containing the metal element may include $MoF_6$, $TaF_5$, $CrF_4$, $TiF_4$, $TiCl_4$, $MoCl_5$, $WCl_6$, $AlCl_3$ or the like. SiO$_2$ has been used as the thin insulating film. However, this invention is not limited to the particular example. For example, it may include Al$_2$O$_3$, BSG (Borosilicate glass), PSG (Phosphosilicate glass), BPSG (Borophosphosilicate glass), nitrides of BN, SiNx, or compound of SiNxOy (where, x, y are numerical values). Further, the thin metal film of W has been used as corresponding to the first and second thin metal films. However, this invention is not limited to the particular example. For example, the first and second thin metal films may include Mo, Ta, Cr, Ti, or Al, or their alloy, or tungsten alloy. Si has been used as the substrate. However, this invention is not limited to the particular example. For example, as shown in FIG. 16, a substrate in which any of elements 34 belonging to the III or V group of the Periodic Table is ion implanted to a part of the surface of the Si substrate 30 and at least Si element is exposed on the portion 30a on which the thin insulating film 31 is not formed on the surface of the Si substrate 30, may be employed. Any structure and quality of material may be employed as a substrate if the Si thin film is formed on the uppermost layer of the substrate. For example, as shown in FIG. 17, a thin Si film may be formed on the surface of a sapphire plate 36. Further, when the thin metal film of W corresponding to the first thin metal film is grown, Si element exposed on the surface of the substrate may be diffused in the thin metal film of W. Even when the thin metal film of Mo, Ta, Cr, Ti or Al, or their alloy or tungsten alloy corresponding to the first thin metal film is grown, the Si element exposed on the surface of the substrate may be diffused in the thin metal film of W.

In the second example, WF$_6$ has been used as the reactive gas containing the metal element. However, this invention is not limited to the particular example. For example, any gases having reactivity which include a metal element may be used like any one or more in combination of metal halogenide such as MoF$_6$, Ta$_5$, CrF$_4$, TiF$_4$, TiCl$_4$, MoCl$_5$, WCl$_6$, AlCl$_3$ or the like.

The quality of the material of the substrate is not particularly limited. In a Si wafer or a wafer process, a predetermined thin film may be already formed on the surface, impurities may be diffused, or the film may be microminiaturized. Or, this invention can be also applied to the substrate of the material such as glass, SiO$_2$, Al$_2$O$_3$, various metals or alloys.

In FIGS. 13 to 15 described and indicated above, there has been explained the growth of the thin metal film of the case that the thin insulating film is formed on a portion of the surface of the substrate, and is not formed on the other surface portion. However, this invention is not limited to such substrate. For example, this invention may also be applied to any substrate that a thin insulating film is formed on a portion of the surface thereof and a thin metal film is formed on the other portion of the surface thereof.

In this case, the substrate 30 as shown in FIG. 14 is fabricated by means of other apparatus, and is disposed in the apparatus in FIG. 1 according to the embodiment of this invention.

Even in this case, H$_2$ may be used as a reducing gas, and WF$_6$ may be used as the gas containing the metal element. However, this invention is not limited to the particular example. Any of gases containing a metal element and the reducing gases may be employed. For example, the gas containing a metal element includes MoF$_6$, TaF$_5$, CrF$_4$, TiF$_4$, TiCl$_4$, MoCl$_5$, AlCl$_3$ or the like. SiO$_2$ has been used as the thin insulating film. However, this invention is not limited to the particular example. For example, Al$_2$O$_3$, BSG (Borosilicate glass), PSG (Phosphosilicate glass), BPSG (Borophosphosilicate glass), nitrides of BN, SiNx or compound of SiNxOy may be employed (wherein x, y are numerical values). Further, the thin metal film of W has been used as corresponding to the first thin metal film. However, this invention is not limited to the particular example. For example, a thin film of a metal such as Mo, Ta, Cr, Ti, Al, Pt, Pd, Au, or Ni, their alloys or tungsten alloy may be employed. Further, in addition, the thin film of metal silicide such as WSix, TiSix, TaSix, MSix, PtSix (where x is a numerical value) or metal nitride such as TiN may be used instead of the thin metal film of W corresponding to the first thin metal film. The thin metal film of W has been used as corresponding to the second thin metal film. However, this invention is not limited to the particular example. For example, the thin film of metal such as Mo, Ta, Cr, Ti, or Al or their alloy or tungsten alloy may be employed. The metal elements of the first and second thin metal films may be the same or different. The substrate is formed with Si. However, this invention is not limited to the particular example. For example, any materials such as SiO$_1$, Al$_2$O$_3$, glass or sapphire may be employed.

The substrate in FIG. 14 may be preferably cleaned, for example, by any means such as a plasma on the surface of the first thin metal film 32 before forming the second thin metal film.

In the examples described above, the case that the thin metal film is formed (selectively grown) on the portion on which the thin insulating film is not formed has been described. However,an experimental data of the case that uniform thin film is formed on the entire surface of the substrate was also provided.

More specifically, the growth of a tungsten silicide film was achieved at 350° C. of growing temperature while rotating the substrate supporting tray by concentrically disposing one substrate (5 inch silicon wafer) with the substrate supporting tray, dividing the slit-like opening of the end portion 11a of the nozzle 11 with a partition into upper and lower portions according to the gas flowing method of this invention, feeding in sheet-like shape reactive gas containing no metal element SiHx and inert gas Ar through one slit as a first gas flow and WF$_6$ gas including a metal element and Ar gas through the other slit, and feeding Ar gas as a second gas flow. It will be considered that since the growth of the Tungsten silicide film is conducted at supplying speed, it can faithfully reflect the state of the flow. The experiments were coincident with the theory. Thus, the resistance value distribution having high uniformity of ±3.8% was obtained in 5 inch wafer. The uniformity of ±8.6% may be theoretically expected in 8 inch wafer.

The foregoing description has been the case of so-called entire surface growth, and WF$_6$ has been used as the reaction gas including metal element. However, this invention is not limited to the particular embodiment. Any of reactive gases containing metal elements may be employed. For example, any one or more in combination of gases of metal halogenide such as MoF$_6$, TaF$_5$, CrF$_4$, TiF$_4$, TiCl$_4$, MoCl$_5$, WCl$_6$, AlCl$_3$ or the like may be employed. SiH$_4$ has been used as the reactive gas containing no metal element has been used. However, this invention is not limited to the particular embodiment. Any of reactive gases containing no metal element may be used. For example, H$_2$, SiH$_2$Cl$_2$ may be used. The reactive gas containing the metal element WF$_6$ and the reactive gas containing no metal element SiH$_4$ have been fed in mixture of Ar gas into the reaction chamber. However, this invention is not limited to the examples. WF$_6$ and SiH$_4$ may be fed without mixture with Ar gas into the reaction chamber. The substrate has used the flat Si.

However, this invention is not limited to the particular example. For example, the material such as $SiO_2$, $Al_2O_3$, glass or sapphire may be used instead of Si.

Figure 18:
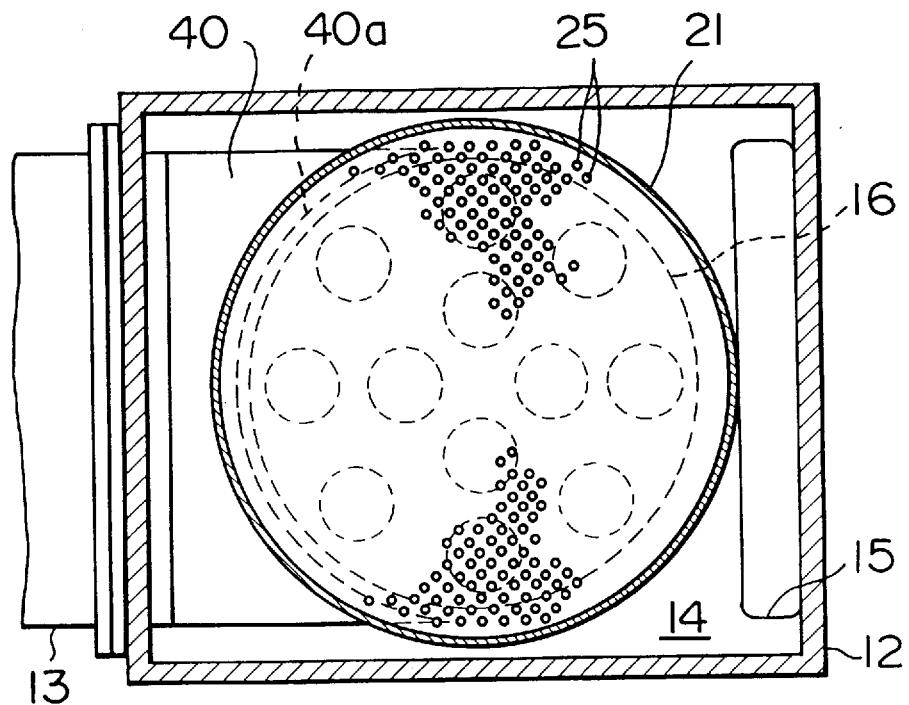
FIG. 18 is a sectional view similar to FIG. 2 of the CVD apparatus of a second embodiment of this invention.

FIG. 18 shows a second embodiment of this invention. In this embodiment, the components and the process are the same as those in the first embodiment except that the shape of a nozzle 40 for injecting a reaction gas is different from that of the first embodiment. The same reference numerals are used to designate the components corresponding to those in the first embodiment.

In this embodiment, the slit-like opening 40a of a nozzle 40 is in a circular-arc shape to be concentrical with a substrate supporting tray 16, and has a diameter which is slightly larger than that of the tray 16.

Figure 19:
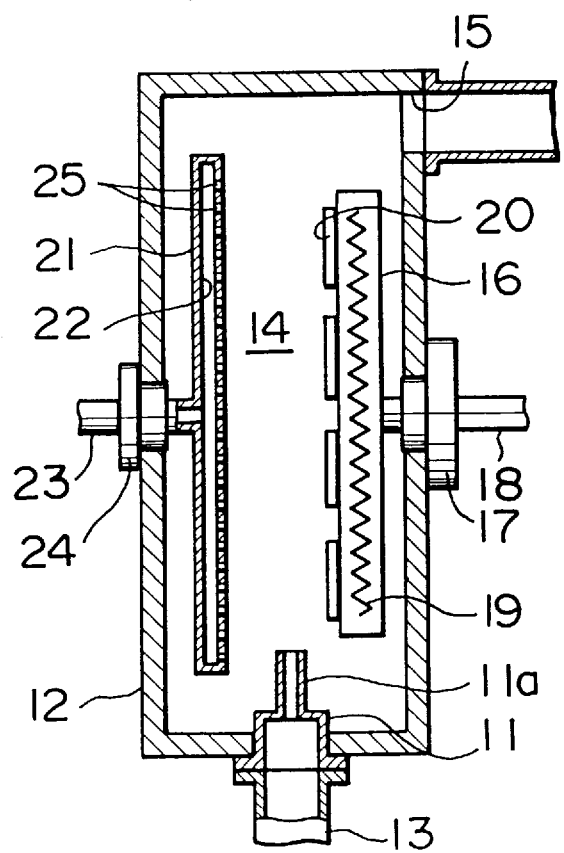
FIG. 19 is a sectional view similar to FIG. 1 of a CVD apparatus of a third embodiment of this invention.

FIG. 19 shows a third embodiment of this invention. In this embodiment, the entire apparatus is displaced with 90° from the first embodiment. The components corresponding to those in the first embodiment are designated by the same or equivalent reference numerals.

In the first embodiment, the substrate supporting tray 16 is disposed horizontally. On the other hand, in this embodiment, the substrate supporting tray 16 is disposed vertically. Correspondingly, the end portion 11a of a nozzle 11 and an inert gas injecting plate 21 are disposed vertically as shown. Even in this construction, it is apparent that the embodiment operates the same as that of the first embodiment and effects the same advantages as those of the first embodiment. Means for preventing the substrates 20 from sliding off from the substrate supporting tray 16 employs conventional means.

The embodiments of this invention have been described. This invention is not limited to the particular embodiments. Various other changes and modifications may be made without the spirit and scope of this invention.

For example, in the embodiments described above, the process in the vacuum chamber has been described. However, this invention may be applied to a CVD apparatus which can process the surface of the substrate at ambient pressure without necessity of vacuum.

Figure 20:
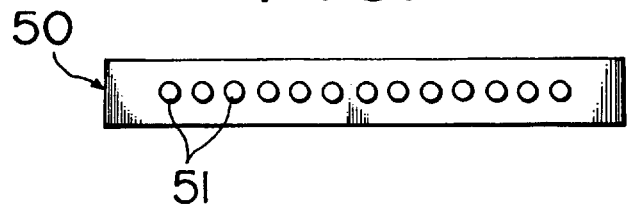
FIGS. 20, 21 and 22 are front views of the essential portions of a modified embodiment according to this invention.
Figure 21:
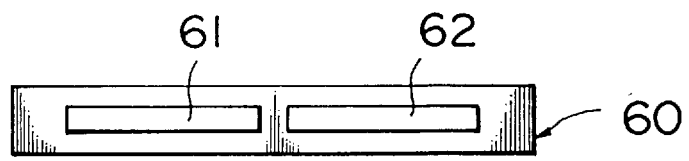
Figure 22:
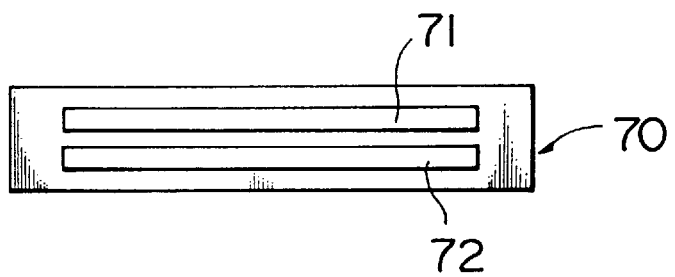

In the embodiments described above, the nozzle 11 or 40 for injecting the reaction gas has had the slit-like opening. This invention is not limited to the particular embodiments. For example, as shown in FIG. 20, a flat hollow conduit 50 formed with a number of small pores 51 may be employed as in the above-described embodiments. Or, as shown in FIGS. 21 and 22, flat hollow conduits 60 and 70 may be used in which slits 61 and 62 aligned laterally or slits 71 and 72 aligned elevationally are formed in the end walls of the flat hollow conduits 60 and 70, respectively. In these cases, different reaction gases may be injected from the slits 61 and 62 or 71 and 72. In this case, partition walls are formed in the conduits 60 and 70. However, two separate conduits each having one slit may be aligned laterally or elevationally.

In the embodiments described above, the inert gas injecting plate 21 of having the openings has been employed. However, a strainer or a honeycomb having suitable aspect ratio may be employed instead. Or, this and the plate having openings may be employed together.

In the embodiments described above, the inert gas has been used as the second gas. However, a gas containing partly a reactive gas may be used instead of the inert gas. In this case, the reactive gas is required to be the type of the gas which does not generate dust particles. For example, $H_{21}$ $N_2$, $O_2$ or the like may be contained.

The substrate holder having heating means in this invention includes not only a holder 16 provided with the heater 19 therein as shown in FIG. 1, but also ones having heating means provided externally. According to the CVD apparatus of this invention, since the first gas flow is a laminar flow, its controllability and reproducibility are excellent. Since the reaction components of the first gas are limited to the space near the substrate, the walls of the process chamber and the window are not contaminated. Accordingly, the quality of the film formed may be improved, and dust particles may be reduced. In the formation of the film, an invasion of a metal element to the substrate, i.e., the encroachment phenomenon can be suppressed. The film thickness distribution control on the substrate can be performed by controlling the flow rate of the second gas. Various advantages that the formation of the film of large area and high uniformity can be performed in combination with the substrate rotating mechanism may be provided.

What is claimed is:

1. A method of thermal chemical vapor deposition comprising the steps of feeding a first gas flow containing reactive gas in a sheet state in parallel with a surface of a heated substrate in a reaction chamber; feeding a second gas flow containing a non-reactive gas perpendicularly towards the surface of the substrate to suppress the diffusion of the first gas flow and to stabilize and laminarize the first gas flow; and externally controlling the flow rates of the first and second gas flows so as to maintain the first gas flow containing the reactive gas in said laminarized flow condition, localize it in the vicinity of the substrate and provide uniformly a film or layer on the surface of the substrate.

2. A method according to claim 1, wherein said first gas flow includes a reactive gas containing a metal element.

3. A method according to claim 1, wherein said first gas flow includes a mixture of reactive gas containing a metal element and a reactive gas containing no metal element.

4. A method according to claim 1, wherein said non-reactive gas is an inert gas.

* * * * *